Dec. 15, 1970 L. C. KINNEY ET AL 3,547,629

PHOTOFLASH METHOD OF TRANSFERRING INFORMATION
AND FABRICATING PRINTED CIRCUITS

Filed July 14, 1966

INVENTORS
LAYTON C. KINNEY
EDWIN H. TOMPKINS
BY Albert Siegel
ATT'Y.

United States Patent Office 3,547,629

Patented Dec. 15, 1970

3,547,629

PHOTOFLASH METHOD OF TRANSFERRING INFORMATION AND FABRICATING PRINTED CIRCUITS

Layton C. Kinney, Chicago, and Edwin H. Tompkins, Riverside, Ill., assignors, by mesne assignments, to American Screen Process Equipment Company, Chicago, Ill., a corporation of Illinois Continuation-in-part of application Ser. No. 226,701, Sept. 27, 1962. This application July 14, 1966, Ser. No. 568,692

Int. Cl. G03c 5/04

U.S. Cl. 96—27 8 Claims

ABSTRACT OF THE DISCLOSURE

A composite article and method of manufacture is disclosed for transferring intelligence including a substrate and a photoflash pyrolyzable layer. The intelligence is transferred by positioning an opaque masking member between a light source and the composite article and photoflashing light through the mask. The layer is pyrolyzed in areas where the photo-energy penetrates the mask. Specifically, a printed circuit is prepared by photoflashing through a mask onto a black nitrocellulose lacquer covered copper metal layer supported on a phenol-formaldehyde resin base. The nitrocellulose lacquer is pyrolyzed in the area of photo-energy impingement to expose the metal which is removed by etching. The lacquer protecting the metal circuit configuration is then removed by dissolution in solvent.

This application is a continuation-in-part of our copending application, Ser. No. 226,701, filed Sept. 27, 1962, now abandoned.

BACKGROUND OF THE INVENTION

This invention is directed to a method of selectively transferring visual information by the impingement of photoflash energy through such information onto a photoflash pyrolyzable material. The invention also pertains to the related apparatus and material which is used in such process. By the practice hereof one may easily and readily transfer visible intelligence onto a plurality of receptor members to rapidly produce, for example, replicates of the original, printing plates, printed circuits, etc.

In its most essential features our invention relates to the use of photoflash energy of relatively high intensity and short duration to selectively pyrolyze and remove portions of a photoflash pyrolyzable surface, e.g., a black, nitrocellulose lacquer, in accordance with the visible intelligence sought to be reproduced thereon. The original copy of such intelligence is positioned intermediate the photoflash pyrolyzable surface and the photoflash energy source and then one passes such energy through such original. Using a photographic negative as one example of the original it is noted that as the photoflash is impinged thereon, portions of the light energy pass through (where the negative is transparent) and other components thereof are blocked (at those positions of the negative which are light opaque). Following such selective passage through the negative the photoflash energy impinges upon the pyrolyzable material to rapidly and selectively remove portions thereof. Accordingly, there results a transfer of the photographic negative image onto the pyrolyzable substrate.

One embodiment of our invention relates to the aforesaid photoflash process whereby printed circuit elements are quickly made.

The presently available methods of preparing printed circuits comprise various modifications of either mechanical or photochemical processes or a combination of these two. In the usual photochemical process the initial procedure is to coat a typical copper foil-covered laminate with a light-sensitive solution of materials such as bichromated albumen or bichromated shellac. The laminate so coated is then exposed through a negative in a vacuum frame to an arc light for several minutes, the negative being in the form of the printed circuit desired. This causes the insolubilization of the bichromated coating in those areas where light has contacted the emulsion, and after such exposure the board is immersed in a developer to dissolve away the unexposed photo-sensitive coating. The board is then etched in a suitable etchant to remove the unwanted foil and the protective material which has previously protected the copper from the etchant is then subsequently dissolved away.

We have discovered a photo-flash method of fabricating printed circuits which is considerably simpler and much more rapid in operation than any of the known processes of the prior art. In addition to these advantages our process operates on a sandwich construction which may be fabricated at the factory and then have a relatively long shelf life, this in marked distinction to the bichromated albumen or other similar materials which have been used in the photo-chemical process of the prior art. Such bichromated materials or other equivalent, photosensitive materials which have been used are of such a nature that they must be applied substantially immediately preceeding the subjection thereto through a negative to an arc light. This important improvement regarding shelf life of our invention will be elaborated upon below.

While our process has excellent utility in the preparation of printed circuit elements, as noted above, it may be used in the production of numerous items which are in some manner duplicates, or having a duplicate surface pattern, of the visible intelligence being reproduced. In the manufacture of printed circuits a metallic interlayer, for example a foil, is interposed in the sandwich-like member having an electrically insulating substrate and the photoflash pyrolyzable material. In other embodiments hereof the photoflash receptor member need only comprise a substrate having such pyrolyzable layer thereon.

The intelligence pattern which is reproduced on the pyrolyzable layer as herein taught must selectively block, preferably reflect and absorb, or shield the underlying pyrolyzable layer. In most instances this will be in the form of intelligence visible to the human eye, e.g., printed matter, but this is not always the case. It is possible to replicate patterns not so visible so long as there is the selective blocking and passage of the photoflash energy by the master pattern being reproduced.

In order to achieve good resolution on the pyrolyzable layer it is necessary that the photoflash be of relatively high intensity and short duration.

Accordingly, a primary object of our invention is to provide a novel method of transferring an intelligence pattern onto a photoflash pyrolyzable member by the use of photoflash energy of relatively high intensity and short duration. Another object of our invention is to provide a novel method of making printed circuits and printed circuit elements which process includes the step of photo-flashing a particular sandwich construction member as hereinafter set out in greater detail. Still another object of our invention is to provide a novel sandwich structure member for use in the fabrication of such printed circuits.

These and other objects, features and advantages of our invention will become apparent to those skilled in this particular art from the following detailed disclosure thereof and the accompanying drawings in which.

Figures 1, 2:
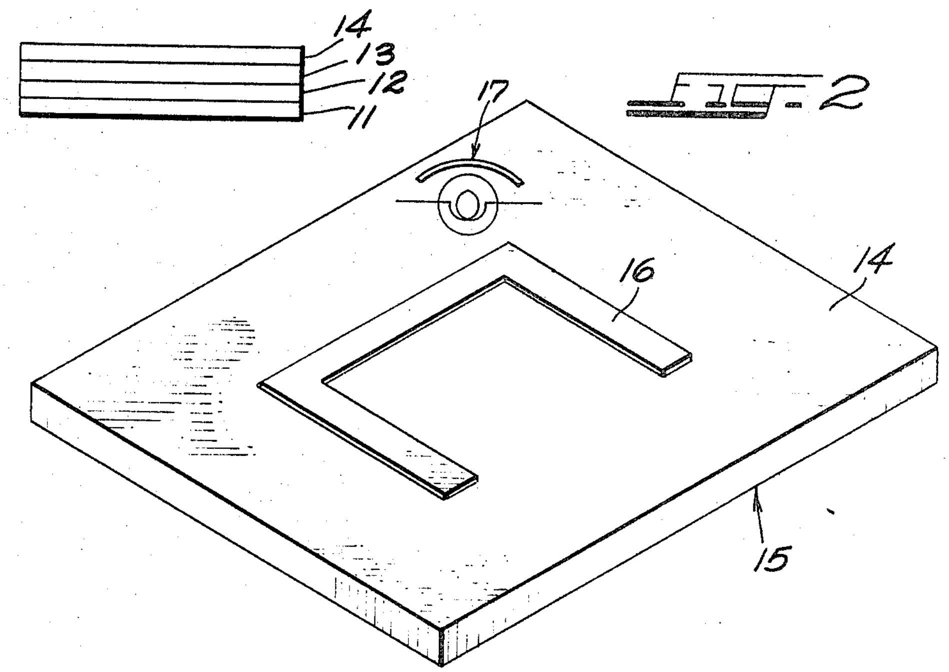
FIG. 1 is an enlarged schematic view of a sandwich circuit board initial structure useful with our invention.
FIG. 2 is a schematic disclosure of one embodiment of our process, namely that of making printed circuits.

Reference should first be had to FIG. 1 which is a schematic drawing of the sandwich-type construction printed circuit board which is used in our invention. This consists essentially of an electrically insulating substrate layer 11 which is usually made of Bakelite, a phenol formaldehyde resin, although it should be understood that the other electrically insulating members may be similarly employed. Bakelite has been used to a considerable extent in the fabrication of printed circuits in the past primarily because of its ready availability and relatively low cost. Superimposed upon the layer 11 is a thin layer of copper foil 12, such foil being strongly adherent to the Bakelite. While copper is specifically mentioned, it will be understood that any other metal which is desired for use in the final printed circuit, for example silver or aluminum, may be substituted in lieu thereof. Generally speaking, the copper is the most desirable material to use when one considers cost and electrical conductivity. Parenthetically, we wish to note that the composite of layers 11 and 12 represent commercially available material and do not constitute a novel aspect of our invention, its use being as a means to readily provide a copper-insulating substrate combination. Superimposed upon and adherent to the copper layer 12 is an etch-resistant coating 13 which is preferably black or other dark color and which acts to absorb substantially all visible light when photo-flashed as hereinafter taught. Upon such layer 13 is then superimposed and attached a semi-transparent etch-resistant coating 14.

We have found layer 13 is preferably fabricated of a nitrocellulose lacquer containing various dyes, pigments such as carbon black or combinations of these two types of materials the purpose and composition of such layer to be eleborated upon subsequently in the present specification. Layer 13 is likewise preferably made with nitrocellulose lacquer but is fabricated to contain considerably less carbon black or dye than layer 14.

In practicing the printed circuit process of our invention the coating 14 is positioned nearest to the photo-flash light source, whereas the electrically insulating layer 11 is placed farthest away therefrom.

FIG. 2 illustrates schematically the photo-flash step of our process. In such figure the numeral 15 represents the entire composite structure shown in FIG. 1. In fabricating the printed circuit element a light opaque stencil of the desired circuit configuration which is denoted in FIG. 2 by the numeral 16 is placed upon the surface 14 of the composite after which the entire assembly is flashed as by the photo-flash unit shown schematically by the numeral 17.

Figure 3:
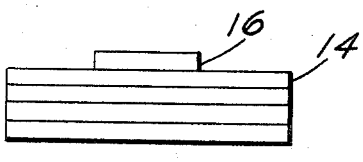
FIGS. 3 through 6 schematically illustrate the phenomena and steps in the printed circuit embodiment of our process.
Figure 4:
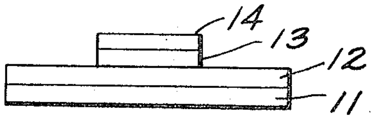

The actual fabrication of the printed circuit element is shown in FIGS. 3 through 6. In FIG. 3 a stencil 16 is schematically shown in place on top of the transparent nitrocellulose lacquer coating 14. This structure is subjected to high intensity photo-flash. The high intensity, short-duration light flash causes pyrolysis of the exposed nitrocellulose lacquer films 13 and 14 but where the stencil protects the coating such pyrolysis does not occur. FIG. 4 illustrates the structure after pyrolysis and upon removal of the stencil member. As illustrated therein at this stage the copper member 12 still retains its original structure but the two nitrocellulose coatings 13 and 14 have been pyrolyzed away except in the area that was immediately below the stencil. Thus layers 13 and 14 remain in the composite but in a physical configuration corresponding to the original configuration of the stencil.

Figure 5:
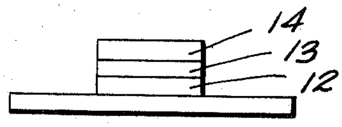

Following such pyrolysis the entire sandwich construction then remaining is immersed in an appropriate etchant—for example, a nitric acid solution to dissolve away the portions of the copper layer 12 which are not protected by the acid-resistant layers 13 and 14. The end result of such acid etching is shown in FIG. 5 where it is readily seen that the copper layer 12 likewise has now assumed the configuration of the original stencil.

Figure 6:
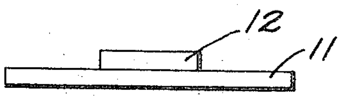

The next step in our process is to remove the acid-resistant layers 13 and 14 in order to leave a copper outline of the printed circuit, this being shown in FIG. 6. The nitrocellulose lacquers are soluble in many organic solvents—for example, acetone or methylethyl ketone and may be removed by the use of these agents.

The net result after flashing to produce pyrolysis, etching away of the superfluous copper or other metal forming the printed circuit and then removal of the etch-resistant coatings is a printed circuit on the Bakelite electrically insulating substrate in accordance with the configuration of the original stencil member.

A multitude of photo-flash methods of the stencil-covered printed circuit composite may be employed. In one embodiment of our invention the assembly was flashed with a xenon-filled quartz flash tube at approximately 7000 volts with an energy output of 10,000 joules and a flash duration of approximately one-half millisecond. Times up to 20 milliseconds may be employed at the option of the user although it is preferred to use as short a time as possible in order to maintain a sharp delineation of the stencil image. Such photo-flash parameters may be used in the various embodiments of our process.

As noted above, the intermediate nitrocellulose lacquer layer 13 is a light absorbent coating. The coating 14 is more transparent to light than is the layer 13. The purpose of using a combination coating in the preferred printed circuit embodiment hereof is to provide a high degree of light absorption in the material immediately adjacent to the copper foil which acts as a heat sink and tends to retard pyrolysis of the film in the area not masked by the stencil. The small amount of carbon in the overlying coat 14 provides a very modest heating effect due to absorption and at the same time permits a major portion of the light energy to reach the base coat. The overlying coat 14 is subsequently pyrolyzed by the heat generated from the base coat 13.

The composition of the nitrocellulose lacquers in layers 13 and 14 is most important. In a preferred embodiment of our invention the light-absorbent coating 13 was formulated by mixing 12 grams of nitrocellulose with a degree of nitration of approximately 10.5 to 12.2% nitrogen, 1.5 grams of carbon black and a lacquer thinner to make 150 milliliters of suspended material. Such coating is applied by a spraying, dipping, roll coating, whirling or other suitable methods to a thickness of approximately 0.001 inch. Thicker coatings may of course be used. The outermost nitrocellulose coating, as denoted by numeral 14, was made in the preferred embodiment of 12 grams of nitrocellulose, again of the same degree of nitration as noted above, 30 milligrams of carbon black along with adequate amounts of lacquer thinner to make 150 milliliters of solution. The latter coating is applied in the same manner as the intermediate light-absorbent coating and is usually fabricated to the extent of about 0.0004 inch. It should be understood that additional lacquer thinner may be used to obtain a suitable consistency for the particular mode of deposition being employed.

It will be appreciated that the two layers 13 and 14 may contain instead of carbon black other suitable pigments or dyes in lieu thereof or in conjunction therewith and still function as above described. Furthermore, while lacquer represents the preferred matrixing material, other etch-resistant materials may be similarly employed.

In a somewhat less preferred embodiment of our invention the two lacquer layers 13 and 14 are replaced by a single etchant-resistant layer of selected opacity. This layer too is pyrolyzed by the effect of photo-flash where not protected by the light opaque stencil in substantially the same manner as in the case of the two-layer system. Carbon black or other pigments and/or dyes may be employed to control the color of such a layer.

In another embodiment of our invention, not directed to the fabrication of printed circuits especially, one most simply employs a substrate member having a layer of photo-flash pyrolyzable material thereon. The master stencil, or photographic negative, or practically anything else which has a pattern permitting the selective blocking and passage of photo-flash energy, is interpositioned between the photo-flash source and the pyrolyzable layer. Upon flashing therethrough, the pyrolyzable layer is selectively destroyed to replicate thereon the original pattern.

It also should be noted that in the various embodiments of our invention, photo-flash pyrolyzable materials other than nitrocellulose can be employed.

It will be understood that various modifications and variations of our process may be effected without departing from the spirit or scope of the novel concepts of our invention.

We claim as our invention:

1. The method of transferring intelligence from a masking member onto a photoflash pyrolyzable member which comprises the steps of: positioning said masking member containing said intelligence between a photoflash pyrolyzable member and a photoflash light source, said pyrolyzable member containing a layer of decomposable nitrocellulose with a dispersion of light absorbing pigment, said pigment absorbing substantially all of said photoflash energy, and energizing said photoflash light source to pyrolyze and effectively remove said layer of decomposable nitrocellulose from said pyrolyzable member in all areas except where said pyrolyzable member is shielded by said masking member against photoflashing by said photoflash light source.

2. The method of transferring intelligence from a masking member onto an intelligence receiving member formed from a substrate having a pyrolyzable coating thereon, said method including the steps of: positioning said masking member containing said intelligence between said intelligence receiving member and a photoflash light source, said pyrolyzable coating on said intelligence receiving member containing nitrocellulose with a dispersion of carbon black therein, and energizing said photoflash light source to expose areas not covered by said masking member to high-intensity, short duration flash energy to initiate pyrolyzation and thereby effectively remove said layer of nitrocellulose from said intelligence receiving member in said areas exposed.

3. In the process of fabricating printed circuits from a composite member consisting of an electrically conductive layer on an electrically insulating substrate member, the improvements comprising: depositing on said electrically conductive layer a first etch-resistant and burn off pyrolyzable coating, which coating decomposes into gaseous components when impinged upon by high-intensity, short duration photoflash energy, depositing on said first coating a second etch-resistant, light absorbent pyrolyzable coating, said second coating being less absorptive to light than said first coating, said first and second coatings being formed essentially of nitrocellulose containing a dispersion of light absorbing pigment, said pigment absorbing substantially all of said photoflash energy; positioning a light opaque masking member containing an opaque pattern in the form of the desired circuit between said second etch-resistane coating and a photoflash light source; photo-flashing in the direction of said masking member to pyrolyze and effectively remove said two pyrolyzable coating layers except where said layers are protected by said masking pattern; removing said masking member; applying an etchant for said conductive layer to remove areas of the said conductive layer not protected by the said pyrolyzable coatings and thereafter removing the remaining portion of said etch-resistant coatings to provide a printed circuit in the form of said masking pattern on said substrate.

4. The process as defined in claim 3 wherein said first and second etch-resistant pyrolyzable coatings consist of nitrocellulose having carbon black suspended therein, said second coating containing less carbon black than said first coating.

5. In the process of fabricating printed circuits from a composite member consisting of an electrically conductive layer on an electrically insulating substrate member, the improvements comprising: depositing on said electrically conductive layer an etch-resistant, solvent soluble, light absorbent and readily pyrolyzable coating, said coating consists essentially of nitrocellulose having suspended therein a dispersion of a light absorbing pigment which absorbs subtantially all of said photoflash energy and said coating being adapted for rapid decomposition so as to be easily removed when impinged upon by high-intensity, short duration photoflash energy, positioning a light opaque masking member containing an opaque member in the form of the desired circuit between said resistant coating and a high-intensity light source; energizing said high-intensity light to provide a short duration flash of light in the direction of said masking member to pyrolyze and completely remove said resistant coating and thereby expose selected areas of said conductive layer while leaving said coating in the areas protected by said masking patterns; removing said masking member, applying an etchant to remove the exposed portions of said electrically conductive layer and thereafter dissolving said coating in said areas protected by said masking member and thereby expose on said substrate member a printed circuit in the form of said masking pattern.

6. The process as defined in claim 5 in which said pigment is carbon black.

7. The process as defined in claim 5 wherein said etchant is an acid and said solvent is a ketone.

8. In a method of fabricating an electrical printed circuit element from a non-exposed composite blank containing an electrically insulating substrate, an electrically conductive layer adherent to the substrate and an acid etch-resistant, organic solvent-soluble, uniformly light absorbent pyrolyzable layer containing nitrocellulose and carbon black covering said electrically insulating layer, said pyrolyzable layer decomposing into gaseous components to completely expose the elecrically conductive layer in selected areas impinged upon by high-intensity, short duration, photoflash energy, the steps comprising: positioning a light opaque mask having an opaque pattern in the desired configuration of the printed circuit in front of said pyrolyzable coating; flashing high-intensity, short duration light energy through the pattern to impinge on the pyrolyzable coating to decompose into gaseous components and thereby remove the coating in the impinged areas to expose the electrically conductive layer; applying etchant to the exposed electrically conductive layer to selectively remove the exposed portions of the electrically conductive layer from the substrate; and applying an organic solvent to the remaining pyrolyzable layer to dissolve the remaining layer and remove it from the electrically conductive printed circuit pattern.

References Cited

Swiggett, R. L.: "Printed Circuits on Foil-Clad Plastics," Plastics Eng., August 1951, pp. 99, 100, 106, 107, 110 and 111.

NORMAN G. TORCHIN, Primary Examiner

C. BOWERS, Assistant Examiner

U.S. Cl. X.R.

96—36.2, 67, 68, 87; 117—8.5, 93.3, 93.31, 216; 156—3, 13, 17; 250—65.1

UNITED STATES PATENT OFFICE
CERTIFICATE OF CORRECTION

Patent No. 3,547,629 Dated December 15, 197

Inventor(s) Layton C. Kinney et al.

It is certified that error appears in the above-identified patent and that said Letters Patent are hereby corrected as shown below:

Column 6, under "References Cited" insert the following:

| | | | |
|---|---|---|---|
| 2,256,642 | 9/1941 | Gaut et al.---------------- | 117-216X |
| 2,554,017 | 5/1951 | Dalton-------------------- | 117-216 |
| 2,555,321 | 6/1951 | Dalton et al. ------------- | 117-216 |
| 2,914,404 | 11/1959 | Fanselau ------------------ | 96-36.2 |
| 2,868,124 | 1/1959 | Crawford ------------------ | |
| 3,016,824 | 1/1962 | Ritzerfeld et al. --------- | 101-149.2 |
| 3,143,423 | 8/1964 | Reynolds et al. ----------- | 96-36.2X |
| 3,201,239 | 8/1965 | Neugebauer et al. --------- | 96-36.2X |
| 2,703,283 | 3/1955 | Eggert -------------------- | 96/88X |
| 3,298,833 | 1/1967 | Gaynor -------------------- | 96/27 |

Eisler, P., "The Technology of Printed Circuits", Heywood and Ltd., London, 1959, TK 7870 E 321959a, (pp. 32-35 relied on).
Ansco Abstracts, Vol. 17. No. 4, table of contents page, pg. 137 April 1957.
Bolt et al., "Radiation Effects on Organic Materials", 1963, p. 532 relied on.
Lundberg et al., Nature (London), Vol. 179, pp. 367-68 (1957)
Webster's Seventh New Collegiate Dictionary, 1965, p. 697 rel on.

Signed and sealed this 7th day of September 1971.

(SEAL)
Attest:

EDWARD M.FLETCHER,JR.
Attesting Officer

ROBERT GOTTSCHALK
Acting Commissioner of Pate